(12) United States Patent
Weiser et al.

(10) Patent No.: US 7,919,004 B2
(45) Date of Patent: Apr. 5, 2011

(54) REMOVING REFLECTIVE LAYERS FROM EUV MIRRORS

(75) Inventors: Martin Weiser, Sinsheim (DE); Olaf Bork, Aalen (DE); Ulrich Andiel, Ulm (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 87 days.

(21) Appl. No.: 12/534,659

(22) Filed: Aug. 3, 2009

(65) Prior Publication Data
US 2010/0027106 A1    Feb. 4, 2010

(30) Foreign Application Priority Data
Aug. 4, 2008 (DE) .................... 10 2008 040 964

(51) Int. Cl.
*B29D 11/00* (2006.01)
(52) U.S. Cl. ............ 216/24; 359/360; 359/582; 359/584
(58) Field of Classification Search .................. 359/359, 359/360, 582, 584, 589; 216/24
See application file for complete search history.

(56) References Cited

U.S. PATENT DOCUMENTS

| | | | |
|---|---|---|---|
| 5,310,603 A | | 5/1994 | Fukuda et al. |
| 5,978,134 A * | 11/1999 | Chaton et al. ................. 359/360 |
| 6,295,164 B1 * | 9/2001 | Murakami et al. ............. 359/584 |
| 6,674,577 B2 | 1/2004 | Slashchenko |
| 6,780,496 B2 * | 8/2004 | Bajt et al. .................... 428/216 |
| 6,872,495 B2 | 3/2005 | Schwarzl |

(Continued)

FOREIGN PATENT DOCUMENTS
DE    101 23 768 A1    12/2002
(Continued)

OTHER PUBLICATIONS

Pawitter J. S. Mangat et al., "Recovery of Mo/Si multilayers coated LTEM substrate", Proc. SPIE, vol. 4889 (2002), pp. 426-430.
(Continued)

*Primary Examiner* — Mark Consilvio
(74) *Attorney, Agent, or Firm* — Sughrue Mion, PLLC

(57) ABSTRACT

A method for removing at least one reflective layer (4a, 4b) from an optical element (1) for EUV lithography, wherein the optical element (1) has a substrate (2) and an interlayer (6) between the substrate (2) and the at least one reflective layer (4a, 4b). The method includes etching away the at least one reflective layer (4a, 4b) as far as the interlayer (6) with an etching gas (7), wherein the material of the interlayer (6) does not react with the etching gas (7), and wherein, after the etching away, the interlayer (6) has a surface roughness of less than 0.5 nm rms, preferably of less than 0.2 nm rms, and more preferably of less than 0.1 nm rms. Also, an optical element (1) for reflecting radiation in the EUV wavelength range includes a substrate (2), at least one reflective layer (4a, 4b), and an interlayer (6) arranged between the substrate (2) and the at least one reflective layer (4a, 4b). The interlayer (6) is composed at least partly of a material which does not react with a halogen or a halogen compound as etching gas (7) and which is selected, in particular, from one or more of the following: alkali metal halides, alkaline earth metal halides and aluminum oxide ($Al_2O_3$). The interlayer (6) has a surface roughness of less than 0.5 nm rms, preferably of less than 0.2 nm rms, and more preferably of less than 0.1 nm rms.

24 Claims, 1 Drawing Sheet

U.S. PATENT DOCUMENTS

Figure 1A:
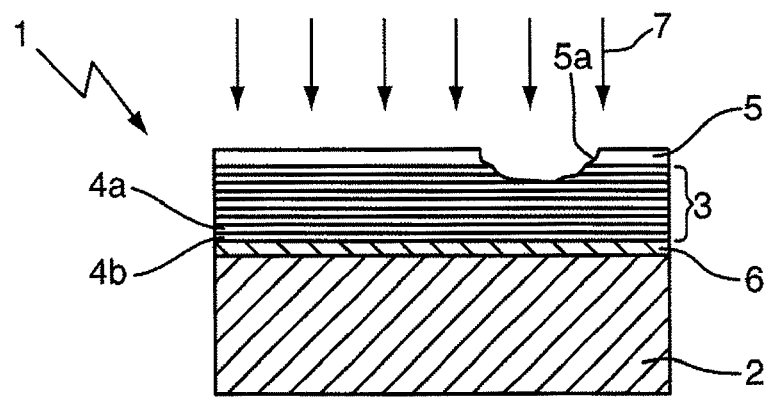

| | | | |
|---|---|---|---|
| 7,282,307 B2 * | 10/2007 | Hector et al. | 430/5 |
| 2002/0063965 A1 | 5/2002 | Slashchenko | |
| 2003/0081722 A1 * | 5/2003 | Kandaka et al. | 378/70 |
| 2003/0214735 A1 | 11/2003 | Masaki et al. | |
| 2004/0002009 A1 | 1/2004 | Yan | |
| 2004/0063004 A1 | 4/2004 | Alkemper et al. | |
| 2004/0202278 A1 | 10/2004 | Dinger et al. | |
| 2005/0197242 A1 | 9/2005 | Mitra et al. | |
| 2006/0222961 A1 * | 10/2006 | Yan | 430/5 |
| 2007/0091420 A1 | 4/2007 | Hosoya et al. | |
| 2009/0174934 A1 * | 7/2009 | Boehm | 359/359 |

FOREIGN PATENT DOCUMENTS

| | | |
|---|---|---|
| DE | 10 2004 008 824 A1 | 9/2005 |
| EP | 1387189 A2 | 2/2004 |
| WO | 97/31132 | 8/1997 |
| WO | 03/016233 A1 | 2/2003 |

OTHER PUBLICATIONS

Paul B. Mirkarimi et al., "Recovery of Multilayer-Coated Zerodur and ULE Optics for Extreme-Ultraviolet Lithography by Recoating, Reactive Ion-Etching, and Wet-Chemical Processes", Applied Optics, vol. 40, Issue 1, Jan. 2001, pp. 62-70.

* cited by examiner

REMOVING REFLECTIVE LAYERS FROM EUV MIRRORS

The following disclosure is based on German Patent Application No. DE 10 2008 040 964.2, filed on Aug. 4, 2008, which is incorporated into this application by reference.

FIELD OF AND BACKGROUND OF THE INVENTION

The invention relates to a method for removing at least one reflective layer from an optical element for EUV lithography. The invention further relates to an optical element for reflecting radiation in the EUV wavelength range, having a substrate and at least one reflective layer.

In order to produce optical elements for EUV lithography, a layer system having a plurality of reflective layers is applied to substrates composed of materials such as Zerodur, Clearceran or ULE. These reflective layer systems typically include layers composed of chemical elements having a low atomic number, such as boron or silicon, which alternate with layers composed of chemical elements having a high atomic number, such as molybdenum or ruthenium. The production of optical elements for EUV lithography is associated with considerable costs due to the required accuracy during their manufacture, yet their service life is limited: by way of example, the reflective coating can degrade as a result of long-term irradiation in a projection exposure apparatus or as a result of faults during the coating process, with the result that the optical properties of the optical element no longer meet the requirements necessary for operation and an aftertreatment becomes necessary, e.g. by removing the reflective layers and applying a new layer system to the substrate.

However, reflective optical elements for EUV applications, due to the short wavelength of approximately $\lambda=13$ nm under which they are usually operated, require a high smoothness of the substrate surface to which the new layer system is to be applied. This smoothness should be present in the form or shape (known as the "figure" in the art), i.e., at low-frequency spatial frequencies of more than 1 $mm^{-1}$, in the medium frequency range, i.e., spatial frequencies between approximately 1 $\mu m^{-1}$ and 1 $mm^{-1}$ (medium spatial frequency range, MSFR), and also in the high frequency range (high spatial frequency range, HSFR), i.e., spatial frequencies of between approximately 0.01 $\mu m^{-1}$ und 1 $\mu m^{-1}$.

Retaining the smoothness of the substrate surface during the reprocessing is difficult since the EUV reflection layers can be eliminated only with considerable polishing and/or etching outlay, for which purpose the mounts and the position systems generally have to be removed from the optical elements beforehand. The polishing and/or etching treatment generally has the effect, in particular, that the figure of the optical element or of the substrate is altered, such that the substrate has to be produced completely anew again.

In order to avoid the problems mentioned above and to introduce optical elements into useful circulation again after their regular or irregular operating period (i.e., in the case of faults during the coating phase) both while maintaining their figure properties and also while retaining their structural engineering properties, various proposals have been made in the literature.

The article "Recovery of Mo/Si multilayers coated LTEM substrate" by Pawitter J. S. Mangat et al., Proc. SPIE, vol. 4889 (2002), pp 426-430, describes a method for removing damaged reflective layers composed of molybdenum and silicon from a coated substrate composed of a material having a low coefficient of thermal expansion, wherein the morphology and the characteristic properties of the substrate are intended not to be impaired. The article proposes etching away the molybdenum and silicon layers using heated potassium hydroxide solution (KOH), in which case the surface roughness increases greatly in part, particularly in the case of substrates having a relatively low coefficient of thermal expansion, and so the article proposes performing further processing steps (polishing etc.) on the substrate after the etching, if appropriate, in order to reestablish the low surface roughness desired.

The article "Recovery of Multilayer-Coated Zerodur and ULE Optics for Extreme-Ultraviolet Lithography by Recoating, Reactive Ion-Etching, and Wet-Chemical Processes" by Paul B. Mirkarimi et al., Applied Optics, Vol. 40, Issue 1, January 2001, pp. 62-70, describes the recovery of substrates coated with multilayer systems inter alia by reactive ion etching or by wet-chemical processes. In the case of reactive ion etching using chlorine as an etching gas on an Mo/Si multilayer system, particularly when a low plasma power is used, the surface roughness of the substrate is intended to vary only slightly. In the case of the wet etching of Mo/Be multilayers using dilute hydrochloric acid (HCl) or of Mo/Si multilayers using Mo/Be layers which are dissolved during the wet etching in order to concomitantly strip away the Mo/Si multilayers, good results are also intended to be achieved in the case of application to substrates having a small diameter. Furthermore, the use of a barrier layer composed of carbon is proposed in order not to damage the substrate during the removal of Mo/Si multilayers in the case of wet etching using hydrofluoric and nitric acid ($HF:HNO_3$).

US 2002/0063965 A1 proposes a method for recovering a substrate, wherein an interlayer is produced between the substrate and the reflective layers, which interlayer contains at least one layer composed of chromium and a layer composed of scandium and is dissolved during wet etching in hydrochloric acid (HCl) in order to concomitantly strip away the overlying layers.

WO 97/31132 describes a method for dry etching, wherein Mo/Si multilayers are removed from super polished Zerodur or fused silica and wherein, under suitably chosen process conditions, only a slight alteration of the figure and the surface roughness of the substrate is brought about. The etching process based on two steps first removes a silicon dioxide covering layer using a fluorine-containing etching gas and subsequently removes the molybdenum and silicon layers using a chlorine-containing etching gas. A newly coated substrate treated in this way is intended to have the same reflectivity for perpendicularly incident light as an optical element having a new, i.e., untreated substrate. However, the plasma etching process increases the surface roughness of the substrate if the surface is exposed to the etching plasma for too long.

In the last-mentioned method, too, the process that proceeds for removing the layers in the plasma etching installation is not completely homogeneous. Since the etching gas reacts with the substrate material, irregular removal occurs on the substrate, as a result of which the figure of the substrate surface can no longer be retained. In this case, figure or surface figure error denotes the deviation of an optical surface from the desired form, which is specified as a maximum deviation perpendicular to the surface in length units or in units of the wavelength used in the measurement. Furthermore, the reaction of the etching gas with the substrate material also increases the surface roughness of the substrate on average (rms value "root mean square"), which adversely affects the reflection properties of the optical element after the renewed coating.

OBJECTS OF THE INVENTION

Objects of the invention include providing a method and an optical element for EUV lithography which permit the surface roughness and the figure of the substrate surface to be retained during the removal of reflective layers using an etching gas.

SUMMARY OF THE INVENTION

These objects are, according to one formulation, achieved by a method of the type mentioned in the introduction wherein the optical element has a substrate and an interlayer between the substrate and the at least one reflective layer, wherein the method includes: etching away the at least one reflective layer as far as the interlayer with an etching gas, wherein the material of the interlayer does not react with the etching gas, and wherein, after the etching away, the interlayer has a surface roughness of less than 0.5 nm rms, preferably of less than 0.2 nm rms, even more preferably of less than 0.1 nm rms.

The inventors have recognized that when applying a buffer layer or interlayer that does not react with the etching gas between the reflective layers and the substrate, the etching process can be stopped at the interlayer, with the result that the figure of the substrate or of the interlayer is substantially maintained. Prior to the etching away, the interlayer already has a surface roughness of less than 0.5 mm rms, which is not increased further by the etching process. The interlayer is typically applied directly on the substrate. If appropriate, it can also be constructed from a plurality of individual layers composed of different materials. Within the meaning of this application, a layer that does not react with the etching gas is also understood to mean a layer whose etching rate for the etching gas is lower than the etching rate of the etching gas at the reflective layers by a multiple, e.g. ten or hundredfold.

In one preferred variant, the etching away is carried out using a halogen or a halogen compound as etching gas. In this case it is possible to make use of the fact that the materials used for the reflective layers typically form volatile halogen compounds under standard ambient conditions (room temperature, standard pressure). If not, the materials used sublimate in ambient conditions in which local temperatures of less than 300° C. are present, such as e.g. in plasma etching installations which can operate locally.

In one particularly advantageous variant, the interlayer is composed at least partly of at least one material selected from the group consisting of: alkali metal halides, alkaline earth metal halides and aluminum oxide ($Al_2O_3$). These materials do not react with halogens or halogen compounds as etching gases. Aluminum oxide, in particular, can be applied very homogeneously and is therefore particularly suitable as material for the interlayer.

In one preferred variant, the etching away is effected by plasma etching in a plasma etching installation. Plasma etching should not be confused with plasma-assisted reactive ion etching (RIE), as described in WO 97/31132 (cited in the introduction). In the case of plasma etching, the material removal is effected by a chemical reaction, such that the material removal is generally effected anisotropically and material-selectively. In contrast thereto, the material removal in the case of plasma-assisted reactive ion etching is primarily effected physically, with the result that this method is generally less material-selective and possibly produces an anisotropy in the material removal.

In a particularly preferred variant, the figure error of the interlayer is altered by less than 0.1 nm, preferably by less than 0.05 nm, by the etching away, with the result that the figure of the surface of the interlayer and thus the figure of the optical element is substantially maintained during the etching away. The retention of the figure is made possible by virtue of the fact that the material of the interlayer is chosen such that it does not react with the etching gas.

In a further advantageous variant, the interlayer is applied to the substrate with a thickness of less than 20 nm, preferably of less than 10 nm, and even more preferably of less than 5 nm, in a preceding step, before the reflective layer(s) is/are applied. The use of a particularly thin layer is advantageous because a thin layer can be applied with greater homogeneity and a smaller absolute deviation than can a thicker layer.

In one particularly advantageous variant, the interlayer is applied to the substrate with a homogeneity of $\lambda/1000$, preferably of $\lambda/5000$, at a wavelength of $\lambda=632$ nm, in a preceding step. In this case, the homogeneity of the layer is measured as a peak-to-valley value at the laser wavelength of 632 nm used for measurement. A high homogeneity of the interlayer is necessary in order to adapt the form of the surface of the interlayer as precisely as possible to the form of the surface of the substrate. In this case, a coating method should be chosen which permits the interlayer to be applied as homogeneously as possible, such as e.g. electron beam coating ("e-beam-coating"), ion beam sputtering or magnetron sputtering.

In one particularly advantageous variant, a terminating layer is applied to the at least one reflective layer wherein a different etching gas than the one used for etching away the at least one reflective layer is used for etching away the terminating layer. The terminating layer serves to protect the underlying reflective layers and can be composed for example of silicon dioxide ($SiO_2$) or an oxidation-resistant metal. By way of example, a fluorine compound can be used as an etching gas for removing the terminating layer, and a chlorine compound for removing the underlying reflective layers.

In a further advantageous variant, at least one reflective layer is applied to the interlayer in a subsequent step. By applying a reflective layer system, it is possible for the optical element to be produced completely again, in which case the optical properties of the reestablished optical element ideally do not differ from the optical properties of a newly produced optical element.

A further aspect of the invention is realized in an optical element of the type mentioned in the introduction wherein the interlayer is composed at least partly of a material which does not react with a halogen or a halogen compound as etching gas and which is selected, in particular, from the group consisting of: alkali metal halides, alkaline earth metal halides and aluminum oxide ($Al_2O_3$), and wherein the interlayer has a surface roughness of less than 0.5 nm rms, preferably of less than 0.2 nm rms, and even more preferably of less than 0.1 nm rms. Such a low roughness of the interlayer enables a reflectivity of more than 65% of the incident EUV light under normal incidence.

In one advantageous embodiment, the material of the at least one reflective reacts with a halogen or a halogen compound as etching gas, wherein the material is selected, in particular, from the group consisting of: molybdenum (Mo), silicon (Si), ruthenium (Ru) and boron (B). In order to etch away the reflective layers it is necessary that the layer materials used react with the etching gas to form volatile compounds, which is the case e.g. for the above-specified materials which are usually used for EUV reflection layers.

In a further advantageous embodiment, the interlayer has a thickness of less than 20 nm, preferably of less than 10 nm, and even more preferably of less than 5 nm. As already explained above, thin layers can be applied particularly homogeneously, where "homogeneously" is understood to mean a uniform thickness and structure as well.

In one advantageous embodiment, the interlayer has a figure error of less than 0.5 nm, preferably of less than 0.2 nm. Such a low figure error makes it possible to ensure a high imaging quality of the optical element. By choosing for the interlayer a layer material which is inert with respect to the etching gas, the figure error changes by less than 0.1 nm during the etching away, with the result that, even in the case of reprocessing two or more times, the figure remains virtually unchanged and does not exceed the values specified above.

In one advantageous embodiment, the material of the substrate has a coefficient of thermal expansion of at most $|0.5 \times 10^{-7}|$ 1/K in an interval of 0° C. to 50° C. In order to produce such a low coefficient of thermal expansion (CTE), use is typically made of glass or glass-ceramic materials—e.g. ULE glass, Clearceram or Zerodur. Glass-ceramic materials having the low coefficient of thermal expansion specified above generally have a crystalline phase and a glass phase. In this case, the crystalline phase has a negative coefficient of expansion, which can be precisely compensated for by the positive coefficient of expansion of the glass phase. Glass materials having a low CTE are generally doped glasses, for example $TiO_2$-doped fused silica. As an alternative undoped glass, e.g. undoped fused silica, can also serve as substrate material.

In one particularly advantageous embodiment, the interlayer has a homogeneity of $\lambda/1000$, preferably of $\lambda/5000$, at a wavelength of $\lambda$=632 nm. The high homogeneity of the interlayer retains the surface form of the substrate, such that the surface form of the interlayer practically corresponds to the surface form of the substrate.

Further features and advantages of the invention are evident from the following description of exemplary embodiments of the invention, with reference to the figures of the drawing showing details essential to the invention, and from the claims. According to various aspect falling within the overall scope of the invention, individual features can each be realized individually by themselves or as combinations and subcombinations in any desired combination.

DRAWING

Figure 1B:
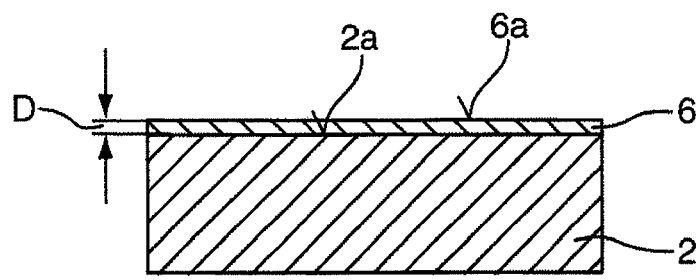
Figure 1C:
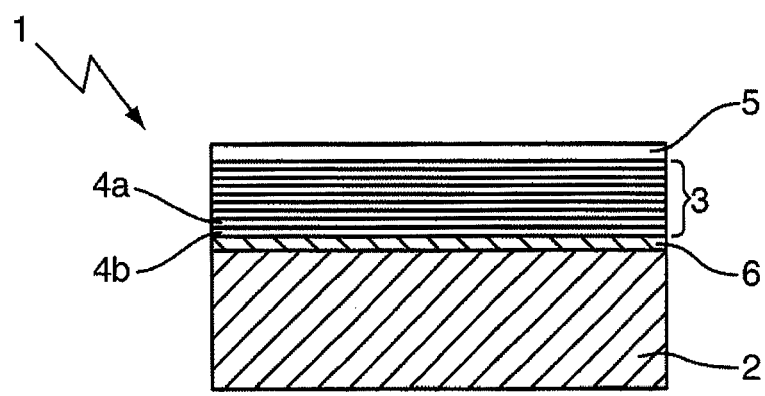

Exemplary embodiments are illustrated in the schematic drawing and are explained in the description below. In the figures:

FIGS. 1a-c show schematic illustrations of an embodiment of an optical element according to the invention before, during and after the reprocessing using a method according to the invention.

DETAILED DESCRIPTION

FIG. 1a schematically shows an optical element 1 for EUV lithography, i.e., for a wavelength range that is typically between 1 nm and 100 nm. The optical element 1 has a substrate 2 composed of Zerodur and also a multilayer system 3 having a plurality of alternating reflective layers 4a, 4b composed of silicon and composed of molybdenum.

In this case, the thicknesses and the number of layers 4a, 4b of the layer system 3 are designed to achieve the highest possible reflectivity for the incident radiation at a wavelength of $\lambda$=13.4 nm. A terminating layer 5 composed of silicon dioxide protects the layers 4a, 4b of the multilayer system 3 from the surroundings. The multilayer system 3 can also have one or more layers (not shown) serving as diffusion barriers between the alternating layers 4a, 4b.

Materials other than those mentioned here can also be used for the substrate 2, the reflective layers 4a, 4b and also the terminating layer 5. Thus, for the substrate 2 it is also possible to use e.g. ULE or Clearceram, which likewise have a coefficient of thermal expansion of at most $|0.5 \times 10^{-7}|$ 1/K in an interval of 0° C. to 50° C., or doped or undoped glasses, in particular fused silica. As an alternative, ruthenium or boron, for example, can be used as materials for the reflective layers 4a, 4b.

The optical element 1 shown in FIG. 1a is damaged in a surface region 5a since a delamination of its layer structure has commenced on account of lengthy irradiation in an EUV projection exposure installation. The optical element 1 has therefore been disassembled from the projection exposure installation and brought into a plasma etching installation (not shown) for reprocessing, in which etching installation the optical element is firstly exposed to a fluorine compound, e.g. $SF_6$ or $CHF_3$, as etching gas 7, in order to remove the terminating layer 5. After the removal of the terminating layer 5, in a further step, the reflective layers 4a, 4b are removed with the aid of chlorine gas ($Cl_2$) or a chlorine compound such as $BCl_3$, $CCl_4$, etc., as etching gas 7 until an interlayer 6 applied on the substrate 2 is reached. The material of the interlayer 6 has been chosen in such a way that it does not react with the etching gas 7, i.e., its etching rate with the etching gas 7 is more than a hundred times lower than the etching rate of the reflective layers 4a, 4b. Therefore, the reflective layers 4a, 4b can be completely removed and the etching process is stopped at the interlayer 6, as is shown in FIG. 1b.

The etching process is a chemically selective plasma etching process, i.e., an etching process which is based on a chemical reaction with the substance to be etched. However, a non-chemically selective, physical etching process such as e.g. plasma-assisted reactive ion etching or a purely physical process such as e.g. ion beam sputtering using noble gases (Ar, etc.) can also be used for removing the terminating layer 5.

The surface 6a of the interlayer 6 has a roughness of less than 0.25 nm rms, which has not altered during the removal of the reflective layers using the etching process. Furthermore, the interlayer 6 has a figure error of less than 0.2 nm. In this case, the figure error has altered by less than 0.1 nm, ideally by less than 0.05 nm, as a result of the etching process.

By way of example, alkali metal halides, alkaline earth metal halides or aluminum oxide ($Al_2O_3$), can be used as materials for the interlayer 6 which do not react with the etching gas 7. These materials are inert to the greatest possible extent with respect to the chlorine-based etching gases used for removing the reflective layers 4a, 4b and can also be used with other halogens or halogen compounds as etching gases.

The interlayer 6 has to be applied on the substrate 2, which is usually super polished, with a high homogeneity in order to cause the form of the surface 6a of the interlayer 6 to correspond as precisely as possible to the surface 2a of the substrate 2. In particular, a homogeneity ("peak-to-valley") of the interlayer 6 of $\lambda/1000$, preferably of $\lambda/5000$, at a measurement wavelength of $\lambda$=632 nm of the interlayer 6, is desired for this purpose. The required homogeneity can be achieved by applying the interlayer 6 as thinly as possible during the production of the optical element 1, i.e., with a thickness D of less than 20 nm. In this case, it has been found that aluminum oxide is particularly advantageous as a layer material since it can be applied particularly homogeneously.

As is shown in FIG. 1c, in a subsequent step, a multilayer system 3 with a terminating layer 5 is applied to the surface 6a of the interlayer 6 again using a conventional coating method.

Through the use of the interlayer 6 in the reprocessing process shown in FIGS. 1a-c, in the end an optical element 1 is obtained having optical properties that ideally have no impairment whatsoever in comparison with a newly produced optical element.

Although the reprocessing method has been described above in connection with a planar substrate, this method can also be used for optical elements having other surface forms, for example for optical elements having spherical, elliptical, parabolic or generally aspherical surface geometries. Moreover, the methods described above are not just limited to halogens as etching gases and materials coordinated therewith for the interlayer. Rather, it is also possible to use other etching gases which, although they react chemically with the reflective layers, essentially do not react chemically with the interlayer.

The above description has been given by way of example. From the disclosure given, those skilled in the art will not only understand the present invention and its attendant advantages, but will also find apparent various changes and modifications to the structures and methods disclosed. The applicant seeks, therefore, to cover all such changes and modifications as fall within the spirit and scope of the invention, as defined by the appended claims, and equivalents thereof.

The invention claimed is:

1. A method for removing at least one reflective layer from an optical element for EUV lithography, wherein the optical element comprises a substrate and an interlayer between the substrate and the at least one reflective layer, the method comprising: etching away the at least one reflective layer as far as the interlayer with an etching gas,
    wherein the material of the interlayer is non-reactive with the etching gas,
    wherein, after the etching away, the interlayer has a surface roughness of less than 0.5 nm rms, and
    wherein the interlayer is composed at least partly of at least one material selected from the group consisting of: alkali metal halides and alkaline earth metal halides.

2. The method according to claim 1, wherein, after the etching away, the interlayer has a surface roughness of less than 0.2 nm rms.

3. The method according to claim 1, wherein, after the etching away, the interlayer has a surface roughness of less than 0.1 nm rms.

4. The method according to claim 1, wherein the etching away is with a halogen or a halogen compound as the etching gas.

5. The method according to claim 1, wherein the etching away comprises plasma etching.

6. The method according to claim 1, wherein a figure error of the interlayer is altered by less than 0.1 nm by the etching away.

7. The method according to claim 1, wherein a figure error of the interlayer is altered by less than 0.05 nm by the etching away.

8. The method according to claim 1, wherein the interlayer, prior to the etching away, has a thickness of less than 20 nm.

9. The method according to claim 1, wherein the interlayer, prior to the etching away, has a thickness of less than 5 nm.

10. The method according to claim 1, further comprising applying the interlayer to the substrate with a homogeneity of $\lambda/1000$ at a wavelength of $\lambda=632$ nm prior to the etching away.

11. The method according to claim 1, further comprising applying the interlayer to the substrate with a homogeneity of $\lambda/5000$ at a wavelength of $\lambda=632$ nm prior to the etching away.

12. The method according to claim 1, wherein the optical element further comprises a terminating layer applied to the at least one reflective layer, the method further comprising etching away the terminating layer with an etching gas differing from the etching gas for etching away the at least one reflective layer.

13. The method according to claim 1, further comprising applying at least one new reflective layer to the interlayer subsequent to the etching away.

14. An optical element for reflecting radiation in the EUV wavelength range, comprising: a substrate and at least one reflective layer, an interlayer between the substrate and the at least one reflective layer, wherein the interlayer is composed at least partly of a material which is non-reactive with a halogen or a halogen compound as etching gas, which material is selected from the group consisting of alkali metal halides and alkaline earth metal halides, and wherein the interlayer has a surface roughness of less than 0.5 nm rms.

15. The optical element according to claim 14, wherein the interlayer has a surface roughness of less than 0.2 nm rms.

16. The optical element according to claim 14, wherein the interlayer has a surface roughness of less than 0.1 nm rms.

17. The optical element according to claim 14, wherein the material of the at least one reflective layer reacts with the halogen or halogen compound as the etching gas, and the reflective layer material is selected from the group consisting of molybdenum, silicon, ruthenium and boron.

18. The optical element according to claim 14, wherein the interlayer has a thickness of less than 20 nm.

19. The optical element according to claim 14, wherein the interlayer has a thickness of less than 5 nm.

20. The optical element according to claim 14, wherein the interlayer has a figure error of less than 0.5 nm.

21. The optical element according to claim 14, wherein the interlayer has a figure error of less than 0.2 nm.

22. The optical element according to claim 14, wherein the material of the substrate has a coefficient of thermal expansion of at most $|0.5\times10^{-7}|$1/K in an interval of 0° C. to 50° C.

23. The optical element according to claim 14, wherein the interlayer has a homogeneity of $\lambda/1000$ at a wavelength of $\lambda=632$ nm.

24. The optical element according to claim 14, wherein the interlayer has a homogeneity of $\lambda/5000$ at a wavelength of $\lambda=632$ nm.

* * * * *

UNITED STATES PATENT AND TRADEMARK OFFICE
CERTIFICATE OF CORRECTION

PATENT NO. : 7,919,004 B2
APPLICATION NO. : 12/534659
DATED : April 5, 2011
INVENTOR(S) : Martin Weiser It is certified that error appears in the above-identified patent and that said Letters Patent is hereby corrected as shown below:

Column 1, lines 18-19: delete "Clearceran" and insert -- Clearceram --

Column 8, line 48: in claim 22 delete "0° C." and insert -- 0° C --

Signed and Sealed this
Tenth Day of July, 2012

David J. Kappos
*Director of the United States Patent and Trademark Office*